(12) United States Patent
Ernst et al.

(10) Patent No.: US 9,000,754 B2
(45) Date of Patent: Apr. 7, 2015

(54) METHOD FOR DETERMINING AN EXCITER CONDUCTOR SPACING FROM A MAGNETIC FIELD SENSOR, METHOD FOR CALIBRATING THE MAGNETIC FIELD SENSOR AS WELL AS CALIBRATABLE MAGNETIC FIELD SENSOR AND USAGE OF AN EXCITER CONDUCTOR STRUCTURE FOR DETERMINING AN EXCITER CONDUCTOR SPACING

(71) Applicant: Fraunhofer-Gesellschaft zur Foerderung der angewandten Forschung e.V., Munich (DE)

(72) Inventors: Roland Ernst, Erlangen (DE); Markus Stahl-Offergeld, Erlangen (DE); Hans-Peter Hohe, Heiligenstadt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 246 days.

(21) Appl. No.: 13/661,987

(22) Filed: Oct. 26, 2012

(65) Prior Publication Data

US 2013/0057256 A1 Mar. 7, 2013

Related U.S. Application Data

(63) Continuation of application No. PCT/EP2011/055224, filed on Apr. 4, 2011.

(30) Foreign Application Priority Data

Apr. 29, 2010 (DE) .......................... 10 2010 028 390

(51) Int. Cl.
*G01R 35/00* (2006.01)
*G01R 33/00* (2006.01)
*G01R 33/07* (2006.01)

(52) U.S. Cl.
CPC ........ *G01R 33/0035* (2013.01); *G01R 33/0005* (2013.01); *G01R 33/07* (2013.01)

(58) Field of Classification Search
CPC ..................................................... G01R 35/005
USPC ................................................... 324/202, 225
See application file for complete search history.

(56) References Cited

U.S. PATENT DOCUMENTS

2009/0140724 A1   6/2009   Kentsch
2010/0117638 A1   5/2010   Yamashita et al.
(Continued)

FOREIGN PATENT DOCUMENTS

DE   10 2007 041 230 B3   4/2009
EP        2049910 B1       6/2007
(Continued)

OTHER PUBLICATIONS

Official Communication issued in corresponding Japanese Patent Application No. 2013-506563, mailed on Feb. 4, 2014.
(Continued)

*Primary Examiner* — Reena Aurora
(74) *Attorney, Agent, or Firm* — Keating & Bennett, LLP

(57) ABSTRACT

In determining an exciter conductor spacing of an exciter conductor of an exciter conductor structure from a sensor element of a calibratable magnetic field sensor, first and second electric currents are impressed into the first and second exciter conductors of the exciter conductor structure to generate first and second magnetic field components in the sensor element of the magnetic field sensor, and a quantity is determined depending on the first and second magnetic field components by means of the sensor element. Further, the exciter conductor spacing of the exciter conductor from the sensor element of the magnetic field sensor is established in dependence on an exciter conductor intermediate spacing between the first exciter conductor and the spaced-apart second exciter conductor and the quantities depending on the first and second magnetic field components.

25 Claims, 6 Drawing Sheets

(56) References Cited

U.S. PATENT DOCUMENTS

2011/0031960 A1  2/2011  Hohe et al.
2012/0016614 A1  1/2012  Hohe et al.

FOREIGN PATENT DOCUMENTS

| EP | 2063229 A1 | 5/2009 |
| EP | 2131205 A1 | 12/2009 |
| JP | 11-223647 A | 8/1999 |
| WO | 20091030361 A1 | 3/2009 |

OTHER PUBLICATIONS

Official Communication issued in International Patent Application No. PCT/EP2011/055224, mailed on Jun. 22, 2011.

Stahl-Offergeld et al., "Integrated Sensitivity Adjustment for 3D Hall Sensors", Sensor Letters, American Scientific Publishers, vol. 7, No. 3, Jun. 1, 2009, pp. 313-316.

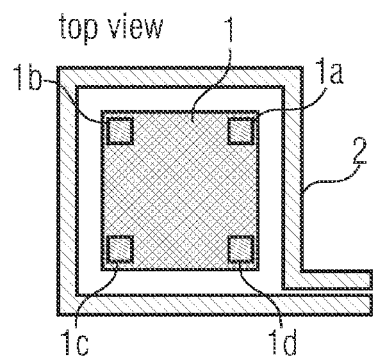
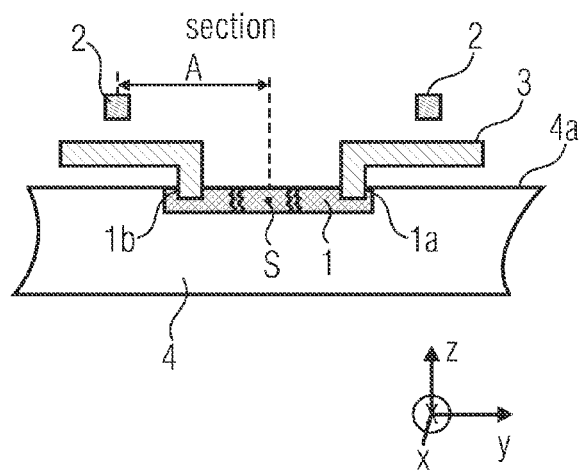
FIGURE 6A
Prior Art
FIGURE 6B
Prior Art
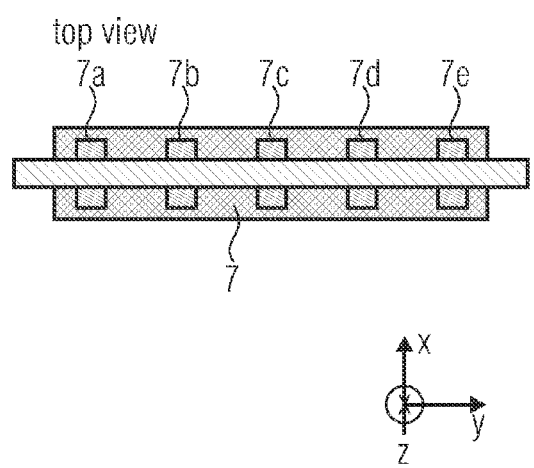
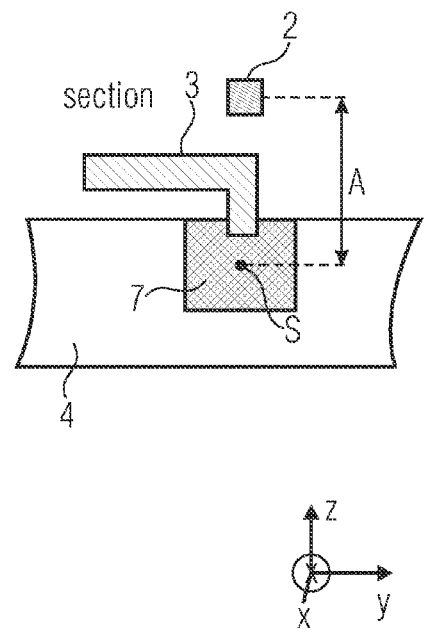
FIGURE 7A
Prior Art
FIGURE 7B
Prior Art

METHOD FOR DETERMINING AN EXCITER CONDUCTOR SPACING FROM A MAGNETIC FIELD SENSOR, METHOD FOR CALIBRATING THE MAGNETIC FIELD SENSOR AS WELL AS CALIBRATABLE MAGNETIC FIELD SENSOR AND USAGE OF AN EXCITER CONDUCTOR STRUCTURE FOR DETERMINING AN EXCITER CONDUCTOR SPACING

CROSS-REFERENCE TO RELATED APPLICATIONS

This application is a continuation of copending International Application No. PCT/EP2011/055224, filed Apr. 4, 2011, which is incorporated herein by reference in its entirety, and additionally claims priority from German Application No. DE 10 2010 028 390.8, filed Apr. 29, 2010, which is also incorporated herein by reference in its entirety.

BACKGROUND OF THE INVENTION

The present invention relates to a method for determining an exciter conductor spacing of an exciter conductor from a sensor element of a calibratable magnetic field sensor, as well as to a method for calibrating a sensor element of the magnetic field sensor and usage of an exciter conductor structure for determining the exciter conductor spacing, as well as a respective calibratable magnetic field sensor. In particular, the magnetic field sensor can be a horizontal or lateral Hall sensor having one or several sensor elements.

For determining the sensitivity of a magnetic field sensor, a magnetic field having a known magnetic flow density can be generated at the location of the sensor via a coil or an exciter conductor. The sensitivity of the sensor can then be inferred via the change of the output signal of the magnetic field sensor. If the magnetic field sensor is a Hall sensor, the output signal can be a respective hall voltage. Thus, in a magnetic field sensor based on a Hall sensor, the sensitivity of the Hall sensor can be inferred by a change of the Hall voltage that can be caused by a change of the magnetic flow density in the sensor element. In integrated magnetic field sensors that are integrated in a semiconductor substrate, such a coil or exciter conductor structure can also be implemented in an integrated manner on the semiconductor chip. The mode of operation of such exciter conductors for Hall sensors is described, for example, in patent specification DE 10 2007 041 230.

In integrated coils or exciter conductor structures, but also in discrete exciter conductor assemblies, the problem can arise that during production of the magnetic field sensor in a semiconductor substrate the individual layer structures are subject to the typical process variations as they occur during the production of semiconductor devices. In a semiconductor device, these process variations can generally be higher in a vertical direction than in a lateral direction with respect to a semiconductor substrate surface. Accordingly, a spacing value of an exciter conductor structure which is implemented, for example as conductive trace above or beside a magnetic field sensor in a semiconductor chip or semiconductor substrate, can deviate from an ideal spacing value aimed at during production. Since the position or effective spacing of the exciter line to the actual sensor element of the magnetic field sensor enters a calibration of the magnetic field sensor by generating a defined magnetic field by means of an electric exciter conductor structure, an inaccurate calibration of the magnetic field sensor can result. Normally, a known current is impressed into the exciter conductor structure during calibration, such that a predetermined magnetic calibration flow density that can be traced back to the exciter line is generated at the location of the sensor element of the magnetic field sensor to be calibrated. Here, the calibration magnetic field is adjustable in a defined manner, for example via the impressed current, the geometry or characteristics of the exciter line, i.e. its height, width, thickness, material as well as its relative position, i.e. its spacing to the sensor element. If the sensor element is, for example, a Hall sensor, the sensor element can be calibrated by determining and allocating the associated Hall voltage. The known magnetic calibration flow densities generated at the location of the sensor element can be allocated to the respective Hall voltages measured with the sensor element of the magnetic field sensor, whereby the sensor element and hence the magnetic field sensor can be calibrated.

FIGS. 6a-b schematically show the top view and sectional view of a conventional lateral Hall sensor in a semiconductor substrate 4. The lateral Hall sensor element 1 has four contact terminals 1a-1d that are provided for electric connection to an external control circuit. A Hall sensor element that is arranged in parallel to a chip surface 4a—the x-y plane—and that can measure a magnetic field component perpendicular to the chip surface is referred to as horizontal or lateral. The lateral Hall sensor 1 can be excited with an exciter line 2 arranged around the sensor and implemented in a coil-like manner, as illustrated in FIG. 6a. This means that a predetermined calibration magnetic field can be generated in the sensor element by impressing a defined current with the help of the exciter conductor. In a lateral or horizontal Hall sensor, the above-mentioned process tolerances when producing the semiconductor device have hardly any influence on the flow density generated by the coil at the location of the lateral Hall sensor, since the spacing A between a sensor center point (sensing center point) S and the exciter line or the coil 2 shown in the sectional view of FIG. 6b is many times greater than the process tolerances during production in lateral direction.

FIGS. 7a-b illustrate the schematic top view and section through a vertical Hall sensor. Vertical means a plane perpendicular to the plane of the chip surface 4a, i.e. vertical to the x-y plane. The vertical Hall sensor element 7 illustrated schematically in FIGS. 7a-b comprises, for example, five contact areas 7a-7e along the main surface 4a of the active semiconductor area. Vertical Hall sensors that can measure a magnetic field component in parallel to the chip surface (x-y level) can also be excited specifically with a current flow by an exciter conductor 2 for calibration. The exciter conductor can, for example, be routed directly over the sensor or in the vicinity past the sensor, as shown schematically in FIG. 7a. In a vertical Hall sensor, the above-mentioned process tolerances can have a particularly strong effect during the production of the Hall sensor, since a spacing A between the center point S of the sensor and the exciter conductor 2 can be in the same order of magnitude as the process tolerances. As a consequence, the sensitivity of vertical Hall sensors can frequently only be determined with relatively low accuracy. Calibration can be inaccurate and comprise variations when same is not performed with an actual spacing value A, but merely with an assumed exciter conductor spacing, which is in reality frequently not completely correct or inaccurate due to the process tolerances during production.

Thus, process tolerances during production can have a particularly strong effect with respect to the substrate surface in vertical direction, such that the actual spacing or the effective relative position can deviate from the actually assumed spacing value of an exciter conductor by which the calibration of the sensor element is performed. Due to that, the sensitivity of such sensors, in particular of vertical Hall sensors, can frequently only be determined with low accuracy.

Thus, it would be desirable to be able to accurately and reliably determine the exciter conductor spacing between an exciter line and a sensor element of a magnetic field sensor in order to obtain improved calibration and hence increased sensitivity of the magnetic field sensor.

SUMMARY

According to an embodiment, a method for determining an exciter conductor spacing of an exciter conductor of an exciter conductor structure from a sensor element of a calibratable magnetic field sensor, the exciter conductor structure including a first exciter conductor and a second exciter conductor spaced apart therefrom, and the sensor element being calibratable by means of the first or second exciter conductor, may have the steps of: impressing a first electric current $I_0$ into the first exciter conductor of the exciter conductor structure to generate a first magnetic field component in the sensor element of the magnetic field sensor; determining a quantity depending on the first magnetic field component by means of the sensor element; impressing a second electric current $I_1$ into the second exciter conductor of the exciter conductor structure to generate a second magnetic field component in the sensor element of the magnetic field sensor; determining a quantity depending on the second magnetic field component by means of the sensor element; and establishing the exciter conductor spacing of the exciter conductor from the sensor element of the magnetic field sensor in dependence on an exciter conductor intermediate spacing between the first exciter conductor and the spaced-apart second exciter conductor and the quantities depending on the first and second magnetic field components.

According to another embodiment, a method for calibrating a magnetic field sensor having at least one sensor element that is calibratable by means of an exciter conductor of an exciter conductor structure, wherein the exciter conductor structure includes a first exciter conductor and a second exciter conductor spaced apart therefrom, may have the steps of: determining an exciter conductor spacing between an exciter conductor of the exciter conductor structure from a sensor element of the calibratable magnetic field sensor; calibrating the sensor element of the magnetic field sensor, wherein calibrating is performed such that by impressing a calibration current into the first or second exciter conductor, a magnetic field component predetermined in dependence on the exciter conductor spacing established in the step of determining, is generated in the sensor element to obtain a calibratable output signal of the sensor element.

According to another embodiment, a calibratable magnetic field sensor having an exciter conductor structure, the exciter conductor structure including a first exciter conductor and a second exciter conductor spaced apart therefrom, and the magnetic field sensor including at least one sensor element that is calibratable by means of a first or second exciter conductor, may have: control means that is implemented to impress, in a spacing determination phase for determining an exciter conductor spacing between the first or the second exciter conductor and the sensor element, a current into the first or second exciter conductor and temporally offset into the other one of the two exciter conductors, to generate different magnetic field components in the sensor element; and evaluation means that is implemented to establish, based on quantities depending on the different magnetic field components and based on an exciter conductor intermediate spacing between the first exciter conductor and the second exciter conductor, the exciter conductor spacing of the first or second exciter conductor from the sensor element.

Another embodiment may have the usage of an exciter conductor structure including a first exciter conductor and a second exciter conductor spaced apart therefrom for determining an exciter conductor spacing between one of the exciter conductors of the exciter conductor structure and a sensor element of a calibratable magnetic field sensor, the magnetic field sensor including at least one sensor element that is calibratable by means of the first or the second exciter conductor, and the exciter conductor structure being implemented such that in a spacing determination phase for determining an exciter conductor spacing between one of the exciter conductors and the sensor element a current can be impressed into the first or second exciter conductor and temporally offset in the other of the two exciter conductors, such that different magnetic field components can be generated in the sensor element for determining the exciter conductor spacing.

Another embodiment may have a computer program for performing the inventive method when the computer program is executed on a computer or a test device for testing the magnetic field sensor.

BRIEF DESCRIPTION OF THE DRAWINGS

Embodiments of the present invention will be detailed subsequently referring to the appended drawings, in which:

FIGS. 6a-b are the top view and the section through a lateral Hall sensor and an exciter line; and FIGS. 7a-b are the top view and the section through a vertical Hall sensor having an exciter line.

DETAILED DESCRIPTION OF THE INVENTION

Figure 1:
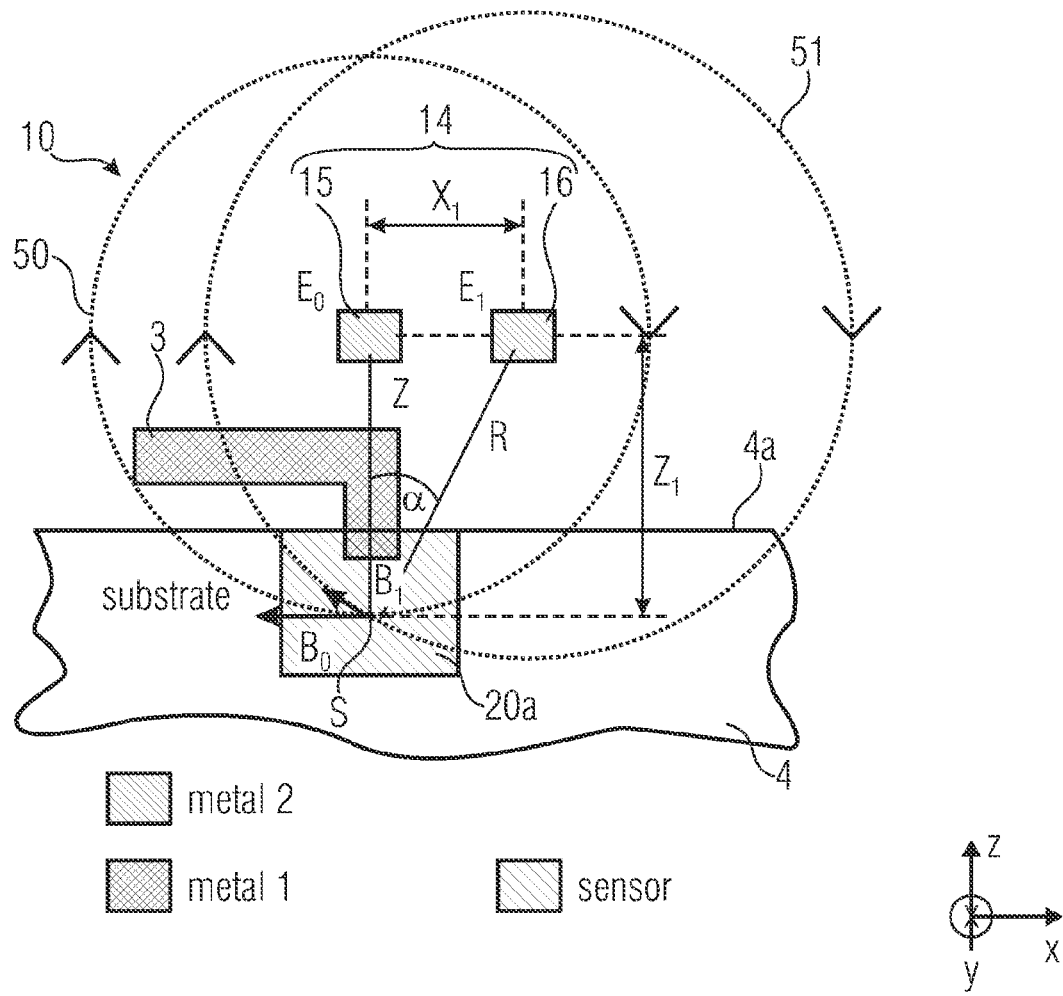
FIG. 1 is the schematic illustration of a section through a sensor element of a magnetic field sensor for illustrating the principle for determining an exciter conductor spacing from the sensor element according to an embodiment of the present invention.

Regarding the following description of the embodiments of the present invention, it should be noted that for simplification reasons, throughout the whole description, the same reference numerals are used in the different figures for equal or functionally equal elements or steps. These elements having the same reference numerals and their functionalities are hence inter-exchangeable in the different embodiments.

FIG. 1 illustrates a schematic section of a magnetic field sensor 10 having a sensor element 20a. The magnetic field sensor 10 can, for example, be a vertical Hall sensor. Based on FIG. 1, the basic process or the inventive method for determining an exciter conductor spacing z from an exciter conductor 15, e.g. the first exciter conductor, to a center point S of the sensor element 20a, will be illustrated below. The sensor element 20a can be implemented in a semiconductor substrate 4 having a semiconductor substrate surface 4a, wherein the first exciter conductor 15 is arranged directly above the sensor element 20a. A second exciter conductor 16 is arranged spaced apart or offset from the first exciter conductor 15, wherein an exciter conductor intermediate spacing between the first exciter conductor 15 and the second exciter conductor 16 corresponds to a value $x_1$. The first exciter conductor 15 and the second exciter conductor 16 together form an exciter conductor structure 14.

As shown schematically in FIG. 1, the sensor element 20a can be implemented in a semiconductor substrate 4, wherein several process layers can be implemented on a semiconductor substrate surface 4a, for example a metal 1 process layer for contact terminals 3 to the sensor element 20a, as well as a metal 2 process layer where first and second exciter conductors 15, 16 can be implemented. The first exciter conductor 15 and the second exciter conductor 16 can be implemented as conductive traces of a semiconductor device. Insulating layers, which are not illustrated in FIG. 1, can be arranged between the individual metallization layers metal 1 and metal 2.

If a current $I_0$ is impressed in the first exciter conductor 15 in a direction of the drawing plane of FIG. 1 (y direction), a magnetic flow density $\vec{B}_0$ is created by the current flow at the location of the sensor. In this embodiment, the magnetic field lines 50 are arranged radially around the exciter conductor in the z-x plane, wherein the sensor element can detect a magnetic field component $B_x$ in x direction.

The magnetic flow density $\vec{B}$ is a vector, which can be illustrated, for example, in a Cartesian coordinate system having linearly independent position vectors x, y, z of respective magnetic field components $B_x$, $B_y$ and $B_z$. For the most simple case that the exciter conductor 15 is routed directly over the sensor, the magnetic flow density in x direction $B_{0,x}$ caused by the current $I_0$ at the location of the sensor, can be determined by:

$$B_{0,x} = \frac{\mu}{2\pi} \frac{I_0}{z} \qquad (1)$$

If a magnetic field $\vec{B}_1$ is generated by a further exciter conductor 16, which has an exciter conductor intermediate spacing $x_1$ with respect to the first exciter conductor, by impressing a current $I_1$ into the second exciter conductor 16, again, radially symmetrical magnetic field lines 51 result, which causes a further magnetic flow density $\vec{B}_1$ at the location of the center point of the sensor element 20a.

Then, in the present embodiment, for the magnetic field component $B_{1,x}$ in the x direction with:

$$\cos a = \frac{z}{R} = \frac{z}{\sqrt{x_1^2 + z^2}} \text{ and } B_{1,x} = \frac{\mu}{2\pi} \frac{I_1}{R} \cos a \qquad (2)$$

wherein R corresponds to the exciter conductor spacing of the second exciter conductor 16 from the sensor element, a magnetic field component according to formula (3) results:

$$B_{1,x} = \frac{\mu}{2\pi} \frac{I_1 \cdot z}{(x_1^2 + z^2)} \qquad (3)$$

Here, it was assumed that the second exciter conductor 16 has the same vertical spacing or distance $z=z_1$ as the first exciter conductor 15 with respect to the center point S of the sensor element 20a. Thereby, the exciter conductor spacing z, with known exciter conductor intermediate spacing $x_1$ and identical impressed currents $I_0=I_1$, can be calculated solely from the measurement values, i.e. the magnetic field components $B_{1,x}$ and $B_{0,x}$ established by the sensor element 20a. The following formula applies:

$$z = x_1 \sqrt{\frac{B_{1,x}}{B_{0,x} - B_{1,x}}} \qquad (4)$$

The generated magnetic flow densities $\vec{B}_0$ and $\vec{B}_1$ should comprise, in the center point S of the sensor element, magnetic field components of different strengths in x direction—i.e. in the direction of the detection direction of the sensor element. Otherwise, as can be seen from equation (4), the denominator would become zero.

The exciter conductor spacing $x_1$ between the first exciter conductor 15 and the second exciter conductor 16 is known or can be determined in a relatively easy manner. As already mentioned, additionally, the horizontal production tolerances in semiconductor devices are generally lower than the vertical production tolerances such that the exciter conductor intermediate spacing aimed for during production can be used.

As can be seen from formula (4), an exciter conductor spacing z of the first exciter conductor from a sensor element of a magnetic field sensor can be determined independent of a sensitivity of the sensor element when determining the magnetic field components and the impressed excitation or coil current, if, for example $I_0=I_1$. A respective sensitivity factor or inaccuracy factor when determining the magnetic field components $B_{1,x}$ and $B_{0,x}$ cancels itself out in the root of formula (4), since only a ratio of $B_{1,x}$ and $B_{0,x}$ is necessitated for determining z. Thus, with known coil or exciter conductor currents $I_0$ and $I_1$, the magnetic flow density at the location of the sensor can be determined, such that the sensitivity of the sensor element 20a can be inferred independent of the process tolerances. Determining the exciter conductor spacing can also be performed without knowing the impressed current $I_0$ and $I_1$, as long as $I_0=I_1$ or when currents $I_0$ and $I_1$ are in a known relation to one another, i.e. for example $I_0=n\,I_1$ applies. In this case, the following results:

$$z = x_1 \sqrt{\frac{n \cdot B_{1,x}}{B_{0,x} - n \cdot B_{1,x}}} \qquad (5)$$

According to further embodiments, the first exciter conductor 15 does not have to be directly vertically over the sensor element 20a (see FIG. 2), if the first exciter conductor 15 is spaced apart from the second exciter conductor 16, i.e., as long as $|x_0| \neq |x_1|$ applies. The quantities $x_0$ and $x_1$ can describe, for example, a lateral spacing with respect to a coordinate system having its origin in the center point S of the sensor element.

Regarding the following description, it should be noted that the terms $\vec{B}_0$ or $\vec{B}_1$ relate to vectors of the magnetic flow density at the location of the sensor, while the terms $B_{0,x}$ and $B_{1,x}$ represent the magnetic field components detected by the sensor element (e.g. in x direction).

Generally, it can be stated that by impressing a first electric current $I_0$ into a first exciter conductor 15 of an exciter conductor structure 14, generally, a first magnetic field component $B_{0,x}$ can be generated in the sensor element 20a of the magnetic field sensor 10. Subsequently, by means of the sensor element 20, the quantity depending on the first magnetic field component $B_{0,x}$ can be established. The quantity can, for example, be an output signal, such as the Hall voltage. The same is measured and can then be stored. Subsequently, the second electric current $I_1$ can be impressed in the second exciter conductor 16 of the exciter conductor structure 14 to generate a second magnetic field component $B_{1,x}$ in the sensor element of the magnetic field sensor. This second magnetic field component $B_{1,x}$ should differ from the first magnetic field component $B_{0,x}$, by analogously considering formula (4). The second magnetic field component $B_{1,x}$ or a quantity depending on the second magnetic field component $B_{1,x}$ can then be determined again by means of the sensor element 20a and possibly be stored or transmitted to an evaluation means for further evaluation. The exciter conductor spacing of the first or second exciter conductor from the sensor element 20a of the magnetic field sensor 10 can then be established in dependence on the exciter conductor intermediate spacing $x_1$ between the first exciter conductor and the second spaced apart exciter conductor and the two quantities depending on the first and second magnetic field components $B_{0,x}$ and $B_{1,x}$. For this, for example, formula (4) or (5) can be used, with the respective geometric arrangement. Establishing or calculating or determining, respectively, can be performed in dependence on a ratio between the magnetic field components $B_{0,x}$ and $B_{1,x}$ and in dependence on the exciter conductor intermediate spacing $x_1$ between the first exciter conductor 15 and the second exciter conductor 16. Impressing a first electric current $I_0$ and impressing a second electric current $I_1$ can be performed subsequently in time according to further embodiments, such that no overlapping of the magnetic flow densities generated by the current flowing in the first and second exciter conductor 15, 16 results. Otherwise, this could result in an inaccurate or wrong calculation of the exciter conductor spacing.

Based on the effective exciter conductor spacing value established in this way, then, by impressing a calibration current in the first or second exciter conductor, an accurately predetermined magnetic field component can be generated in the sensor element to obtain a calibratable output signal of the sensor element 20a. With the help of the established "accurate" exciter conductor spacing, a "more accurate" calibration of the magnetic field sensor can be performed with the at least one sensor element 20a. The calibratable output signal can, for example, be an output voltage value of a Hall sensor element that is compared with an expected target value or allocated to a specific magnetic field component value. By determining the exciter conductor spacing, a magnetic field component generated in the sensor element can be predetermined very accurately by impressing the predetermined calibration current in the exciter conductor, and the respective output signal of the sensor element can be calibrated accurately and reliably.

Figure 2:
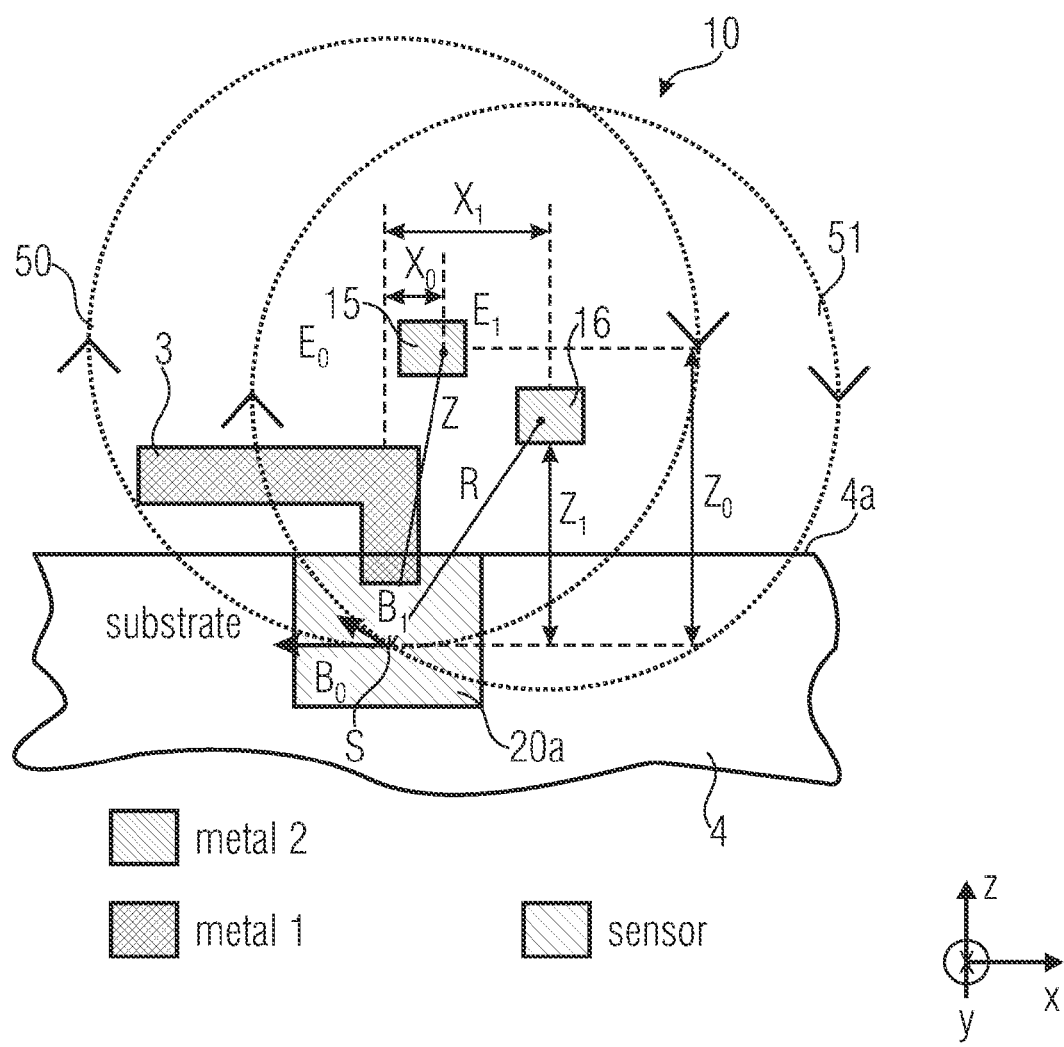
FIG. 2 is a further schematic illustration of a section through a sensor element of a magnetic field sensor, wherein the exciter conductors are arranged in a manner offset to each other and with respect to the sensor element, according to a further embodiment of the present invention.

In a further embodiment of the present invention as illustrated in FIG. 2, the exciter conductor spacing $z_0$ between the first exciter conductor 15 and the center point S of the sensor element 20a can differ from the spacing $z_1$ between the second exciter conductor 16 and the plane through the center point S of the sensor element in parallel to the xy plane. In the above-stated cases, for the exciter conductor spacing determination between the first exciter conductor and the sensor element 20a of the magnetic field sensor, other relations result that differ from formulas (3) and (4), which can be determined with the help of respective vector calculation and trigonometric functions. Influences of geometric changes with respect to the position of the exciter conductor can be determined by complex transformations with the help of trigonometric functions and methods of vector calculation, as long as the magnetic field components of $B_{0,x}$ and $B_{1,x}$ in the first center point S of the sensor element are different.

Figure 3:
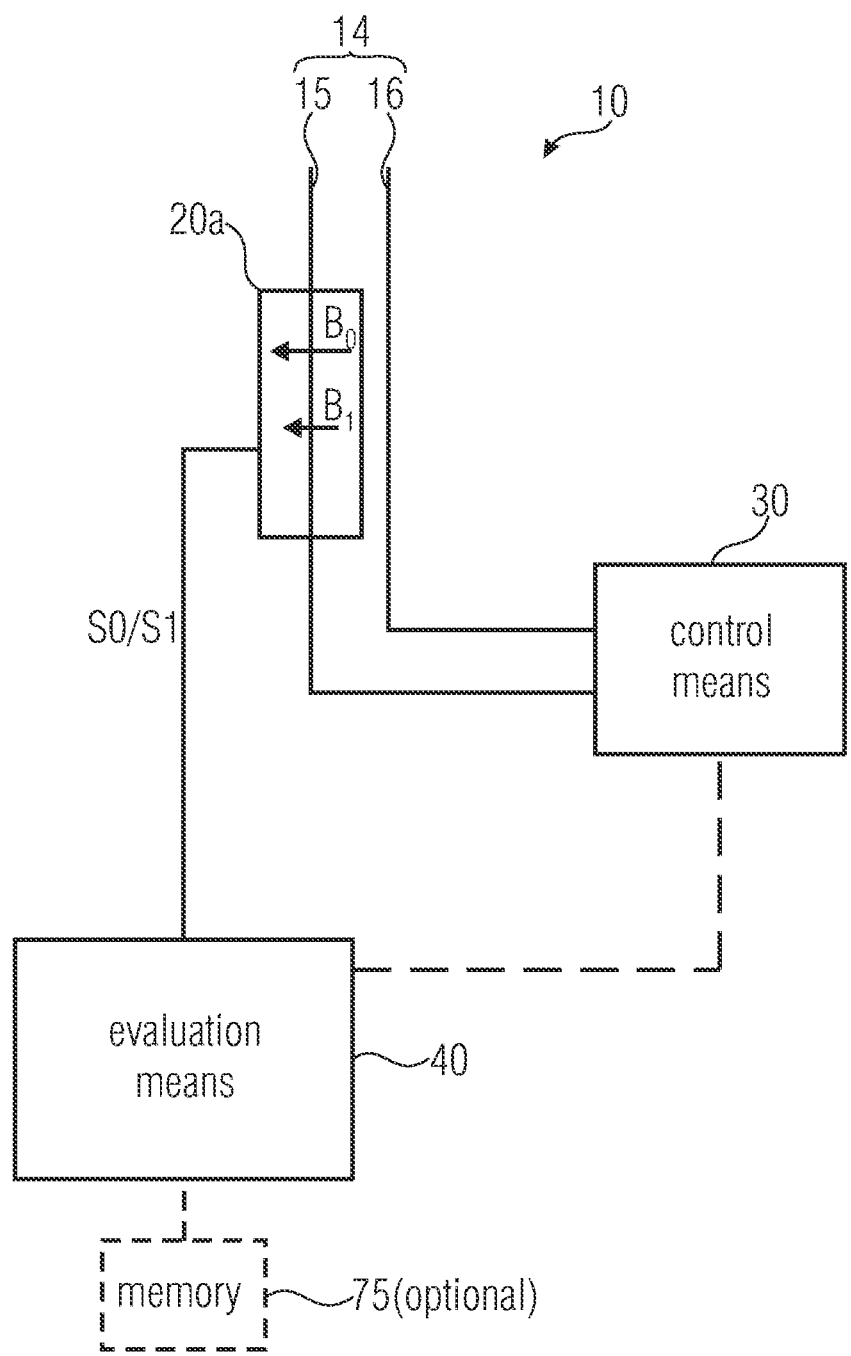
FIG. 3 is the schematic top view of a magnetic field sensor with a sensor element and two allocated exciter conductors of an exciter conductor structure according to an embodiment of the present invention.

In the following, based on FIG. 3, a possible realization of a calibratable magnetic field sensor 10 will be illustrated taking into account the above-described determination of an exciter conductor spacing. FIG. 3 illustrates the schematic top view of a calibratable magnetic field sensor 10 with a sensor element 20a and an exciter conductor structure 14 consisting of a first exciter conductor 15 and a second exciter conductor 16 spaced apart therefrom. Further, the calibratable magnetic field sensor can comprise a control means 30 and an evaluation means 40. The control means 30 is implemented to impress an electric current $I_0$, $I_1$ in the first or second exciter conductor 15, 16 and temporally offset in the other one of the two exciter conductors to generate respectively different parallel magnetic field components $B_{0,x}$ and $B_{1,x}$ in the sensor element 20a. Then, the sensor element outputs different output signals or quantities depending on the magnetic field components $B_{0,x}$ and $B_{1,x}$. Thus, the control means 30 can impress, for example, a first current $I_0$ in the first exciter conductor 15, such that a first magnetic field component $B_{0,x}$ is generated in the sensor element, which then outputs a first output signal $S_0$. Later or subsequently, a second electric current $I_1$ is impressed in the second exciter conductor 16 by the control means 30, such that a second magnetic field component $B_{1,x}$ differing from the first magnetic field component $B_{0,x}$ is generated in the sensor element 20a. Accordingly, this sensor element outputs a second output signal $S_1$ differing from the first output signal, or provides the same to the evaluation means.

The evaluation means 40 can be implemented to establish the exciter conductor spacing of the first or second exciter conductor from the center point S of the sensor element 20a, based on the quantities depending on the different magnetic field components $B_{0,x}$ and $B_{1,x}$ and based on the exciter conductor intermediate spacing $x_1$ between the first and second exciter conductor 15, 16. Thus, the evaluation means 40 can be coupled to the sensor element 20a and establish the exciter conductor spacing z or R (cf. FIG. 1, 2) between the first or second exciter conductors 15, 16 and the sensor element 20a based on the different first and second output signals of the sensor elements and the exciter conductor intermediate spacing.

As will become clear, for example in the context of formula (4), the evaluation means 40 can be implemented to establish an exciter conductor spacing z or R of the first or second exciter conductor 15, 16 from the respective sensor element 20a based on a ratio of the different quantities depending on the magnetic field components $B_{0,x}$ and $B_{1,x}$ and based on the exciter conductor intermediate spacing.

Further, the evaluation means 40 can be coupled to the control means 30, as illustrated by the dotted line in FIG. 3, for example to exchange data or control signals with the control means 30. This information exchange, for example of the established exciter spacing, can be necessitated for subsequent calibration. For example, the evaluation means could send information on the exciter conductor spacing to the control means 30, whereupon the control means 30 impresses a predetermined calibration current, in dependence on the established exciter conductor spacing for a more accurate or exact calibration of the sensor element 20a, into the first or second exciter conductor. This means the control means 30 and the evaluation means 40 can, for example, exchange measurement data, such as magnetic field measurement data, control data or, for example, the height of the currents to be impressed or impressed, but also the established data, such as the exciter conductor spacing.

Further, the calibration process of the magnetic field sensor 10 can comprise a step of comparing the output signal of the sensor element with a target value or a step of allocating the output signal to a specific magnetic field component value. This means the output signals determined by a sensor element can be compared to expected target values or these output signals are allocated to specific magnetic field component values.

In embodiments, the evaluation means 40 can be implemented as on-chip control means in the semiconductor substrate in which the magnetic field sensor is arranged. The evaluation means can be implemented as digital sequence control, as (micro) electronic circuit or as micro controller that can be integrated in the semiconductor substrate together with the magnetic field sensor. In other embodiments, the evaluation means 40 can also be an off-chip or external evaluation means, which is, for example, part of a test device.

As also shown schematically in FIG. 3, the calibratable magnetic field sensor 10 can further optionally comprise a memory 75. In this memory, the established exciter conductor spacing can be stored, such that the same can be reused anytime during a later calibration to be able to perform an exact and accurate calibration. The memory 75 can be integrated in the magnetic field sensor, in the evaluation means 40 or on-chip in the semiconductor substrate in which the magnetic field sensor is also implemented.

During a production test the exciter conductor spacing can be established for every magnetic field sensor, for example either on wafer level and/or in the back end on package level, and its individually established exciter conductor spacing can be stored in its associated memory 75, such that during a later calibration of the respective magnetic field sensor in the application, the stored individual exciter conductor spacing can be accessed at any time, also repetitively. Thus, the exciter conductor spacing determination has to be performed only once, while during a later calibration phase, in dependence on the stored exciter conductor spacing, a predetermined magnetic field component can be generated repetitively by impressing a respective calibration current and thus the magnetic field sensor can be repetitively calibrated. By the defined calibration current, a calibratable output signal of the sensor element can be generated, which can then be used for calibrating the sensor element by a comparison with a target value or an allocation of the sensor output signal to a magnetic field component comparison value.

In embodiments, the inventive methods for determining an exciter conductor spacing and for calibrating can be performed with a test device for magnetic field sensors. Such a test means can, for example, comprise so-called front end and/or back end test systems, but also laboratory test devices that do not need to be optimized for series production. A computer program or program code preforming the inventive methods can be executed on the test device.

Figure 4:
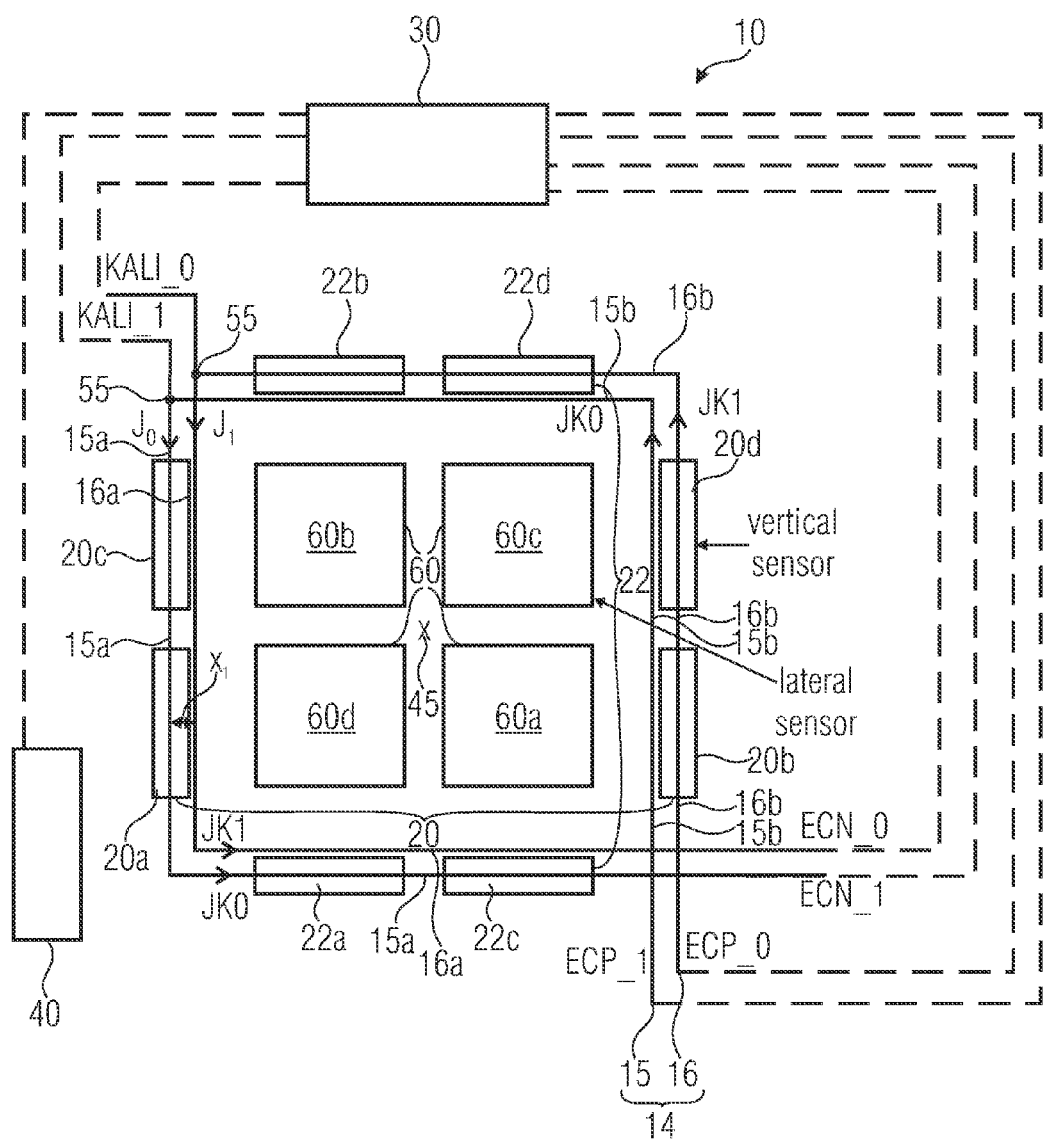
FIG. 4 is the top view of a calibratable magnetic field sensor for detecting magnetic field components in three dimensions according to a further embodiment of the present invention.

According to embodiments of the present invention, a calibratable magnetic field sensor 10 can comprise one or also several sensor elements as shown schematically in FIG. 4. For example, a calibratable magnetic field sensor can comprise one, two or four lateral Hall sensor elements and/or one, two, four, eight or more vertical Hall sensor elements. The exciter conductor structure 14 with the first 15 and second 16 exciter conductor can be arranged, for example, directly above or offset in proximity above the sensor elements in order to be able to calibrate the sensor elements. The calibratable magnetic field sensor can be a multi-dimensional Hall sensor for determining a magnetic field in one or several spatial directions.

FIG. 4 illustrates, in a schematic top view, a calibratable magnetic field sensor 10 with an exciter conductor structure 14 according to an embodiment of the present invention. The inventive calibratable magnetic field sensor can be a magnetic field sensor comprising one or several vertical and/or horizontal Hall sensors for detecting spatial components of a magnetic field in a reference point 45. The calibratable magnetic field sensor 10 as shown schematically in FIG. 4 comprises a plurality of Hall sensor elements for determining a magnetic field in a reference point 45. In this embodiment, the magnetic field sensor comprises three sensor element assemblies 20, 22 and 60, each consisting of four allocated sensor elements 20a-20d, 22a-22d and 60a-60d. The opposing paired sensor elements, such as 20a and 20c or 22c and 22d can be arranged symmetrically to one another. Thereby, the exciter conductors 15, 16 can be arranged asymmetrically with respect to the paired sensor elements, such that during a calibration phase the magnetic field that can be generated by impressing a calibrating current $I_{K0}$ in the first exciter conductor 15 and a calibration current $I_{K1}$ in the second exciter conductor 16, unequal calibration magnetic field components can be generated in the paired sensor elements arranged opposed to each other. The calibration currents can be impressed, for example, simultaneously or in a temporally overlapping manner into the exciter conductor structure 14. In further embodiments, the calibration currents can also be impressed sequentially.

The exciter conductor structure 14 comprises a rectangular or coil-like structure. The exciter conductor can, for example, be conductive traces in a metallization plane above the sensor elements in a semiconductor substrate or also an external discrete exciter conductor structure or coil respectively mounted above the sensor elements. In an exciter conductor spacing determination phase, i.e. when the exciter conductor spacing of a first exciter conductor 15 or a second exciter conductor 16 from a sensor element is to be determined, a first current $I_0$ and a second current $I_1$ can be impressed either temporally offset sequentially only in a section 15a or 15b of the first exciter conductor 15 or a section 16a or 16b of the second exciter conductor 16, wherein the sections can each be allocated to one sensor element of the sensor elements arranged symmetrically at least in pairs. The sections 15a and 16a can comprise two adjacent sides of the rectangular exciter conductor structure 14. Depending on which sensor elements the exciter conductor spacing is to be determined to, such a section can obviously also comprise sections 15b and 16b.

By impressing the currents only into these sections, overlapping and hence corruption of the respective magnetic field components in the respective center point S of the respective sensor element can be avoided, while during a calibration phase the magnetic fields can be overlapped when impressing a current into the two exciter conductors 15 and 16 and a resulting exciter or calibration magnetic field can be generated. With respect to the sensor elements, the exciter conductors 15 and 16 can be arranged symmetrically in pairs, however, this does not have to be the case, but generally, any geometry allowing the generation of defined different calibration magnetic field components within a sensor element assembly is possible. If an exciter line or coil runs directly above the vertical sensor elements, its influence on the same is significantly higher than the influence of an adjacent or laterally offset exciter line or coil.

Further, as already described above, the calibratable magnetic field sensor can comprise a control means 30 and an evaluation means 40. The control means 30 and the evaluation means 40 can be on-chip means, but also external devices by which the respective currents are impressed into the exciter conductor structure 14 and the respective output signals of the sensor elements are established and correspondingly the exciter conductor spacing is determined. Thus, the control means 30 and the evaluation means 40 can be on-chip or off-chip device that can be implemented in hardware or software and whose processes run, for example, on a computer or microprocessor and hence comprise a respective computer program or software or, for example, also on a definite sequence control.

In the following, for the embodiment in FIG. 4, the exciter conductor spacing determination phase and calibration phase will be described in more detail. In a spacing determination phase for determining an exciter conductor spacing of the first or second exciter conductor to a sensor element of the magnetic field sensor, the control means 30 can impress a current, for example, only into section 15a or 16a allocated to the sensor element to which the exciter conductor spacing is to be determined. For this, for example a first current $I_0$ can be impressed into section 15a of the first exciter conductor 15 and later or subsequently a second current $I_1$ into section 16a of the second exciter conductor. Thereby, as already described above, different magnetic field components $B_{0,x}$ and $B_{1,x}$ are generated, for example in the sensor element 20a, by the help of which the effective spacing value or exciter conductor spacing between the first exciter conductor 15 and the sensor element 20a can be determined.

If, for example, a spacing value is to be determined between the first exciter conductor 15 and the sensor element 20c, currents $I_0$ and $I_1$ can be impressed by the control means 30 across sections 15b and 16b, wherein in this case no current is impressed across sections 15a and 16a.

In a calibration phase, all sensor elements 20a-20d, 22a-22d and 60a-60d of a calibratable magnetic field sensor can be excited via exciter conductors 15 and 16 or coils 15 and 16. This means by impressing a specific calibration current, predetermined calibration magnetic filter components can be generated in the respective sensor elements in dependence on the established exciter conductor spacing. A respective calibration current $I_{K0}$ can flow from terminal ECP_0 to terminal ECN_0 of the first exciter conductor 15, and a calibration current $I_{K0}$ can be impressed from terminal ECP_1 to terminal ECN_1 of the second exciter conductor 16. Then, the respective sensor element outputs a respective calibratable output signal.

However, during a spacing determination phase, the current only flows through part of the exciter conductors 15, 16, either from KALI_0 to ECN_0 and/or from KALI_1 to ECN_1. For the currents to be accordingly impressed during the calibration phase and the spacing determination phase, for example during the spacing determination phase, the terminals ECP_0 and ECP_1 can be switched open in a high ohmic state by the control means 30. During a calibration phase, however, terminals KALI_1 and KALI_0 can be switched open in a high ohmic state, such that the current flow differing for the calibration measurement phase and the spacing determination phase can be enabled in the exciter conductor structure 14.

Figure 5:
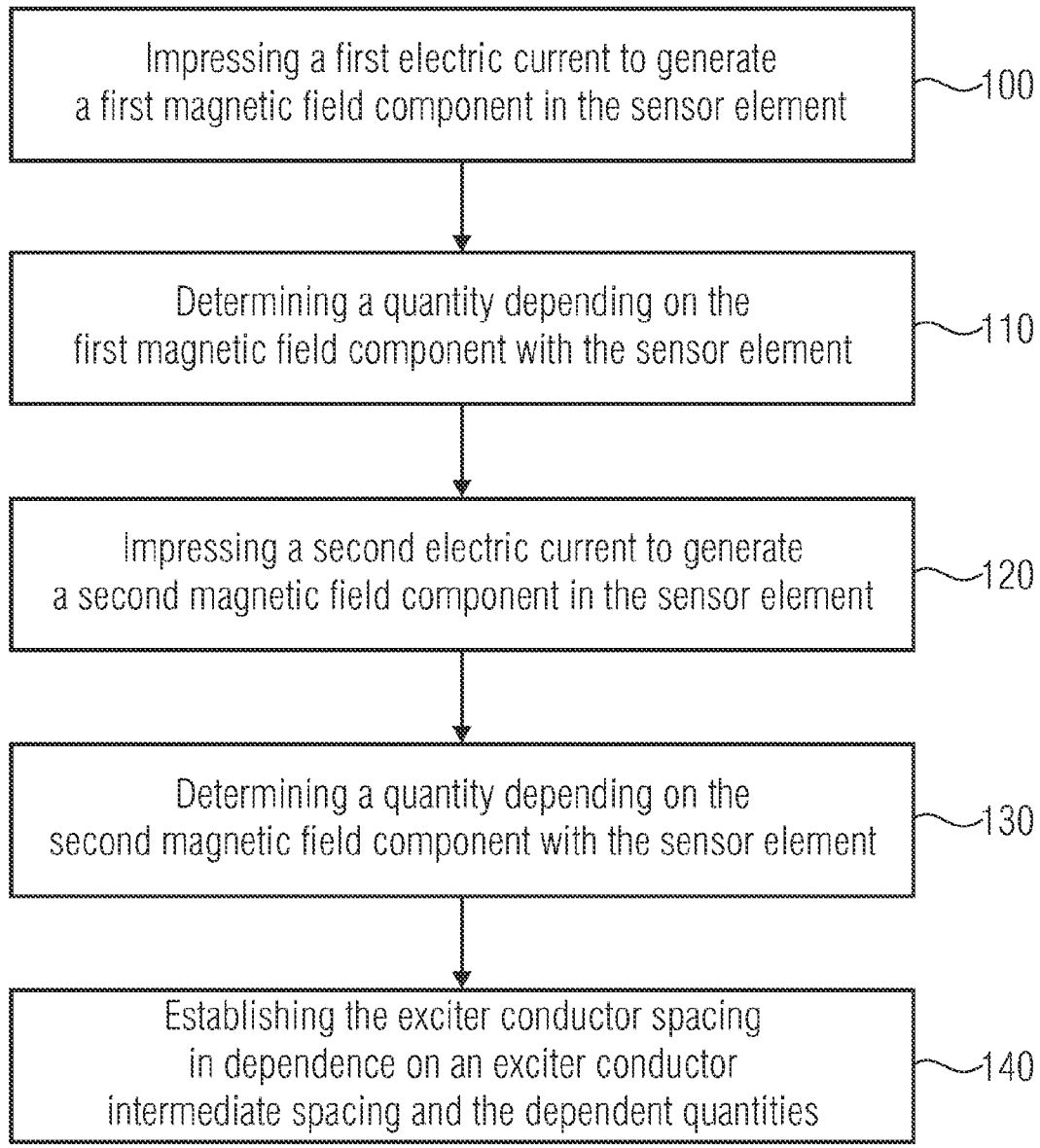
FIG. 5 is a flow diagram of the inventive method for determining an exciter conductor spacing according to an embodiment of the present invention.

As illustrated in FIG. 5 in a flow diagram and as can be seen from the above statements, the method for determining an exciter conductor spacing of an exciter conductor from a sensor element, can comprise impressing 100 a first electric current $I_0$ into the first exciter conductor of an exciter conductor structure to generate a first magnetic field component $B_{0,x}$ in a sensor element 20a of a magnetic field sensor 10. Further, determining 110 a quantity depending on the first magnetic field component $B_{0,x}$ by means of the sensor element 20a can be performed, as well as impressing 120 a second electric current $I_1$ in the second exciter conductor 16 of the exciter conductor structure 14 to generate a second magnetic field component $B_{1,x}$ in the sensor element 20a of the magnetic field sensor 10. In a step of determining 130, a quantity depending on the second magnetic field component $B_{1,x}$ can be determined by means of the sensor element 20a. Further, a step of establishing 140 the exciter conductor spacing of the exciter conductor 15 or 16 from the sensor element 20a of the magnetic field sensor 10 in dependence on an exciter conductor intermediate spacing between the first exciter conductor 15 and the spaced-apart second exciter conductor 16 and the quantities depending on the first and second magnetic field components $B_{0,x}$ and $B_{1,x}$ will be performed.

Further, although several aspects of the invention have been described in the context of an apparatus, it should be noted that it is obvious that these aspects also represent a description of the respective method, such that a block or device of an apparatus can also be considered as a respective method step or feature of a method step. Analogously, aspects that have been described in the context of or as a method step also represent a description of a respective block or detail or feature of a respective apparatus.

Depending on the specific implementation requirements, embodiments of the invention can be implemented in hardware or in software. The implementations can be performed by using a digital memory media, for example a floppy disk, a DVD, a Blu-ray Disk, a CD, a ROM, a PROM, an EPROM, a EEPROM or a FLASH memory, a hard disk or another magnetic or optical memory on which electronically readable control signals are stored that can cooperate or cooperate with a programmable computer system such that the respective method is performed. Thus, the digital memory medium can be computer readable. Thus, some embodiments according to the invention also comprise a data carrier comprising electronically readable control signals that are able to cooperate with a programmable computer system such that one of the methods described herein is performed.

Generally, embodiments of the present invention can be implemented as computer program product with a program code, wherein the program code is effective to perform one of the methods when a computer program product runs on a computer or a test device. The program code can, for example, also be stored on a machine-readable carrier or be implemented as semiconductor circuit.

In other words, an embodiment of the inventive method is a computer program comprising a program code for performing one of the methods described herein when the computer program runs on a computer, a microprocessor or a microcontroller. Thus, a further embodiment of the inventive method is a data carrier (or a digital memory medium or a computer-readable medium) on which the computer program for performing one of the methods described herein is recorded.

Generally, in some embodiments, the methods are performed by any hardware device. The same can be all-purpose hardware such as a computer processor (CPU), a hardware specific for the method such as an ASIC, or a digital sequence circuit.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Method for determining an exciter conductor spacing of an exciter conductor of an exciter conductor structure from a sensor element of a calibratable magnetic field sensor, the exciter conductor structure comprising a first exciter conductor and a second exciter conductor spaced apart therefrom, and the sensor element being calibratable by means of the first or second exciter conductor, comprising:
impressing a first electric current $I_0$ into the first exciter conductor of the exciter conductor structure to generate a first magnetic field component in the sensor element of the magnetic field sensor;
determining a quantity depending on the first magnetic field component by means of the sensor element;
impressing a second electric current $I_1$ into the second exciter conductor of the exciter conductor structure to generate a second magnetic field component in the sensor element of the magnetic field sensor;
determining a quantity depending on the second magnetic field component by means of the sensor element; and
establishing the exciter conductor spacing of the exciter conductor from the sensor element of the magnetic field sensor in dependence on an exciter conductor intermediate spacing between the first exciter conductor and the spaced-apart second exciter conductor and the quantities depending on the first and second magnetic field components.

2. Method for determining an exciter conductor spacing according to claim 1, wherein in the steps of impressing the first and second electric currents $I_0$, $I_1$ are impressed subsequently into the first and second exciter conductors by a controller.

3. Method for determining an exciter conductor spacing according to claim 1, wherein in the steps of impressing different parallel first and second magnetic field components are generated in the sensor element.

4. Method for determining an exciter conductor spacing according to claim 1, wherein the step of establishing is performed with an evaluator, wherein the evaluator is provided with the quantities determined in dependence on the magnetic field components and the exciter conductor intermediate spacing for determining the exciter conductor spacing.

5. Method for determining an exciter conductor spacing according to claim 1, wherein in the steps of determining output voltage values of the sensor element are determined as the quantities depending on the magnetic field components.

6. Method for determining an exciter conductor spacing according to claim 1, wherein the step of establishing is performed by considering a trigonometrical relationship based on the spatial arrangement of the first and second exciter conductor and a center point S of the sensor element to each other.

7. Method for determining an exciter conductor spacing according to claim 1, wherein the magnetic field sensor comprises a sensor element assembly comprising at least two paired sensor elements arranged symmetrically, and wherein the exciter conductor is arranged asymmetrically with respect to the paired sensor elements.

8. Method for determining an exciter conductor spacing according to claim 7, wherein the steps of impressing are performed such that the currents $I_0$ and $I_1$ are each impressed only in sections of the first and second exciter conductors allocated to the at least one of the paired sensor elements of the sensor element assembly arranged symmetrically.

9. Method for determining an exciter conductor spacing according to claim 8, wherein the exciter conductor structure is implemented as rectangular exciter loop, such that currents $I_0$ and $I_1$ are each impressed only in sections of the first and second exciter conductors comprising two adjacent sides of the rectangular exciter loop.

10. Method for determining an exciter conductor spacing according to claim 1, further comprising a step of storing the established exciter conductor spacing in an on-chip memory element allocated to the magnetic field sensor.

11. Method for calibrating a magnetic field sensor comprising at least one sensor element that is calibratable by means of an exciter conductor of an exciter conductor structure, wherein the exciter conductor structure comprises a first exciter conductor and a second exciter conductor spaced apart therefrom, the method comprising:
determining an exciter conductor spacing of an exciter conductor of an exciter conductor structure from a sensor element of a calibratable magnetic field sensor, the exciter conductor structure comprising a first exciter conductor and a second exciter conductor spaced apart therefrom, and the sensor element being calibratable by means of the first or second exciter conductor, comprising:
impressing a first electric current $I_0$ into the first exciter conductor of the exciter conductor structure to generate a first magnetic field component in the sensor element of the magnetic field sensor;
determining a quantity depending on the first magnetic field component by means of the sensor element;
impressing a second electric current $I_1$ into the second exciter conductor of the exciter conductor structure to generate a second magnetic field component in the sensor element of the magnetic field sensor;
determining a quantity depending on the second magnetic field component by means of the sensor element; and
establishing the exciter conductor spacing of the exciter conductor from the sensor element of the magnetic field sensor in dependence on an exciter conductor intermediate spacing between the first exciter conductor and the spaced-apart second exciter conductor and the quantities depending on the first and second magnetic field components;
calibrating the sensor element of the magnetic field sensor, wherein calibrating is performed such that by impressing a calibration current into the first or second exciter conductor, a magnetic field component predetermined in dependence on the exciter conductor spacing established in the step of determining, is generated in the sensor element to acquire a calibratable output signal of the sensor element.

12. Method for calibrating a magnetic field sensor according to claim 11, wherein the step of calibrating further comprises a step of comparing the output signal with a target value or a step of allocating the output signal to a magnetic field component value.

13. Calibratable magnetic field sensor comprising an exciter conductor structure, the exciter conductor structure comprising a first exciter conductor and a second exciter conductor spaced apart therefrom, and the magnetic field sensor comprising at least one sensor element that is calibratable by means of a first or second exciter conductor, comprising:
controller that is implemented to impress, in a spacing determination phase for determining an exciter conductor spacing between the first or the second exciter conductor and the sensor element, a current into the first or second exciter conductor and temporally offset into the other one of the first and second exciter conductors, to generate different magnetic field components in the sensor element; and
evaluator that is implemented to establish, based on quantities depending on the different magnetic field components and based on an exciter conductor intermediate spacing between the first exciter conductor and the second exciter conductor, the exciter conductor spacing of the first or second exciter conductor from the sensor element.

14. Calibratable magnetic field sensor according to claim 13, wherein the controller is further implemented to generate, during a calibration phase by impressing a current in the first or second exciter conductor, a magnetic field component predetermined in dependence on the exciter conductor spacing determined in the spacing determination phase in the sensor element to acquire a calibratable output signal of the sensor element.

15. Calibratable magnetic field sensor according to claim 13, wherein the evaluator is implemented to establish, based on a ratio of the quantities depending on the different magnetic field components and based on the exciter conductor intermediate spacing, an exciter conductor spacing of the first or second exciter conductor from the sensor element.

16. Calibratable magnetic field sensor according to claim 13, wherein the sensor element is a vertical Hall sensor that is implemented to determine a magnetic field in parallel to a main surface of the semiconductor substrate in which the magnetic field sensor is implemented.

17. Calibratable magnetic field sensor according to claim 13, wherein the calibratable magnetic field sensor is implemented as multi-dimensional Hall sensor comprising a plurality of allocated Hall sensor elements for determining a magnetic field in a reference point.

18. Calibratable magnetic field sensor according to claim 13, wherein the first exciter conductor or the second exciter conductor is implemented as discrete exciter conductor.

19. Calibratable magnetic field sensor according claim 13, further comprising an on-chip memory that is implemented to store the exciter conductor spacing determined in the spacing determination phase.

20. Calibratable magnetic field sensor according to claim 13, wherein the evaluator is implemented as on-chip controller in a semiconductor substrate in which the magnetic field sensor is arranged.

21. Usage of an exciter conductor structure comprising a first exciter conductor and a second exciter conductor spaced apart therefrom for determining an exciter conductor spacing between one of the first and second exciter conductors of the exciter conductor structure and a sensor element of a calibratable magnetic field sensor, the magnetic field sensor comprising at least one sensor element that is calibratable by means of the first or the second exciter conductor, and the exciter conductor structure being implemented such that in a spacing determination phase for determining an exciter conductor spacing between one of the first and second exciter conductors and the sensor element a current can be impressed into the first or second exciter conductor and temporally offset in the other of the first and second exciter conductors, such that different magnetic field components can be generated in the sensor element for determining the exciter conductor spacing.

22. Usage of an exciter conductor structure for determining an exciter conductor spacing according to claim 21, wherein the magnetic field sensor comprises a sensor element assembly comprising at least two paired sensor elements arranged symmetrically, and wherein the exciter structure is arranged asymmetrically with respect to the paired sensor elements.

23. Usage of an exciter conductor structure for determining an exciter conductor spacing according to claim 22, the exciter conductor structure being implemented such that in the spacing determination phase the current can each be impressed only in sections of the first and second exciter conductor that are allocated to the paired sensor elements of the sensor element assembly arranged symmetrically.

24. Usage of an exciter conductor structure for determining an exciter conductor spacing according to claim 23, the exciter conductor structure being implemented as rectangular exciter loop, such that in the spacing determination phase the sections into which current can be impressed comprise two adjacent sides of the rectangular exciter loop.

25. A non-transitory computer readable medium including a computer program for performing, when the computer program is executed on a computer or a test device for testing a magnetic field sensor, the method for determining an exciter conductor spacing of an exciter conductor of an exciter conductor structure from a sensor element of a calibratable magnetic field sensor, the exciter conductor structure comprising a first exciter conductor and a second exciter conductor spaced apart therefrom, and the sensor element being calibratable by means of the first or second exciter conductor, the method comprising:
impressing a first electric current $I_0$ into the first exciter conductor of the exciter conductor structure to generate a first magnetic field component in the sensor element of the magnetic field sensor;
determining a quantity depending on the first magnetic field component by means of the sensor element;
impressing a second electric current $I_1$ into the second exciter conductor of the exciter conductor structure to generate a second magnetic field component in the sensor element of the magnetic field sensor;
determining a quantity depending on the second magnetic field component by means of the sensor element; and
establishing the exciter conductor spacing of the exciter conductor from the sensor element of the magnetic field sensor in dependence on an exciter conductor intermediate spacing between the first exciter conductor and the spaced-apart second exciter conductor and the quantities depending on the first and second magnetic field components.

\* \* \* \* \*